US011621259B2

(12) United States Patent
Nakamura et al.

(10) Patent No.: US 11,621,259 B2
(45) Date of Patent: Apr. 4, 2023

(54) SEMICONDUCTOR CHIP

(71) Applicant: SOCIONEXT INC., Kanagawa (JP)

(72) Inventors: Toshihiro Nakamura, Yokohama (JP);
Taro Fukunaga, Yokohama (JP)

(73) Assignee: SOCIONEXT INC., Kanagawa (JP)

( * ) Notice: Subject to any disclaimer, the term of this patent is extended or adjusted under 35 U.S.C. 154(b) by 78 days.

(21) Appl. No.: 17/233,177

(22) Filed: Apr. 16, 2021

(65) Prior Publication Data

US 2021/0233902 A1 Jul. 29, 2021

Related U.S. Application Data

(63) Continuation of application No. PCT/JP2018/038999, filed on Oct. 19, 2018.

(51) Int. Cl.
*H01L 27/02* (2006.01)
*H01L 23/528* (2006.01)
*H01L 23/00* (2006.01)

(52) U.S. Cl.
CPC ...... *H01L 27/0207* (2013.01); *H01L 23/5286* (2013.01); *H01L 24/48* (2013.01); *H01L 2224/48227* (2013.01); *H01L 2924/15311* (2013.01)

(58) Field of Classification Search
CPC .. H01L 23/5286; H01L 24/48; H01L 27/0207
See application file for complete search history.

(56) References Cited

U.S. PATENT DOCUMENTS

| 8,549,447 B2 | 10/2013 | Eisenstadt |
| 2001/0011768 A1* | 8/2001 | Kohara ............... H01L 24/49 |
| | | 257/E23.079 |
| 2009/0166620 A1 | 7/2009 | Maede |
| 2010/0252830 A1 | 10/2010 | Osajima |
| 2015/0372008 A1 | 12/2015 | Danardono et al. |

(Continued)

FOREIGN PATENT DOCUMENTS

| JP | H09115945 A | 5/1997 |
| JP | 2009164195 A | 7/2009 |
| WO | 2009084100 A1 | 7/2009 |

(Continued)

OTHER PUBLICATIONS

International Search Report dated Jan. 8, 2019 in International Application No. PCT/JP2018/038999, with English translation.

(Continued)

*Primary Examiner* — Walter H Swanson
(74) *Attorney, Agent, or Firm* — McDermott Will & Emery LLP

(57) ABSTRACT

A semiconductor chip includes a first cell row constituted by I/O cells arranged in the X direction and a second cell row constituted by I/O cells arranged in the first direction, spaced from the first cell row by a predetermined distance in the Y direction. A plurality of external connecting pads include pads each connected with any of the I/O cells and a reinforcing power supply pad that is not connected with any of the I/O cells and is connected with a pad for power supply. The reinforcing power supply pad is placed to lie in a region between the first cell row and the second cell row.

19 Claims, 13 Drawing Sheets

(56) References Cited

U.S. PATENT DOCUMENTS

2019/0051588 A1 2/2019 Nakamura et al.
2019/0051601 A1 2/2019 Hirose et al.

FOREIGN PATENT DOCUMENTS

| WO | 2014119096 A1 | 8/2014 |
| WO | 2017169150 A1 | 10/2017 |
| WO | 2017183352 A1 | 10/2017 |

OTHER PUBLICATIONS

Written Opinion dated Jan. 8, 2019 in International Application No. PCT/JP2018/038999, with English translation.

* cited by examiner

US 11,621,259 B2

SEMICONDUCTOR CHIP

CROSS-REFERENCE TO RELATED APPLICATIONS

This is a continuation of International Application No. PCT/JP2018/038999 filed on Oct. 19, 2018. The entire disclosure of this application is incorporated by reference herein.

BACKGROUND

The present disclosure relates to a semiconductor chip having a core region and an I/O region.

Recent semiconductor integrated circuits are becoming larger in scale, and with this the number of input/output signals is increasing. Therefore, in a device in which a semiconductor integrated circuit is constituted, i.e., a semiconductor chip, the number of external connecting pads for exchange of signals, etc. with the outside is widely increasing. The increase in the number of external connecting pads leads to increase in the area of the semiconductor chip. Also, it is difficult to make such external connecting pads finer for fear of shorting during the fabrication process.

U.S. Pat. No. 8,549,447 discloses a semiconductor integrated circuit in which I/O cells are arranged in two rows and, in each I/O cell row, bonding pads are arranged in a staggered pattern.

SUMMARY

In the case of connecting a semiconductor integrated circuit to the outside through bonding wires, it is necessary to separate bonding pads from one another by a predetermined distance to prevent the bonding wires from being shorted with one another. For this purpose, when I/O cells are arranged in two rows, as in the cited patent, the I/O cell rows must be separated from each other, and this produces dead space.

An objective of the present disclosure is providing a semiconductor integrated circuit in which reduction in area is achieved by effectively using dead space produced when I/O cell rows are separated from each other.

In one mode of the present disclosure, a semiconductor chip, having a core region in which an internal circuit is formed and an I/O region lying between the core region and a periphery of the semiconductor chip, includes: a plurality of I/O cells placed in the I/O region; and a plurality of external connecting pads connected with the outside of the semiconductor chip, wherein the plurality of I/O cells include a first cell row constituted by I/O cells arranged in a first direction, the first direction being a direction along the periphery of the semiconductor chip, and a second cell row constituted by I/O cells arranged in the first direction, spaced from the first cell row by a predetermined distance in a second direction perpendicular to the first direction, the plurality of external connecting pads include a plurality of cell connecting pads each connected to any of the plurality of I/O cells, and a reinforcing power supply pad that is not connected to any of the plurality of I/O cells and is connected to a cell connecting pad used for power supply out of the plurality of cell connecting pads, and the reinforcing power supply pad is placed so that the center of the pad lies in a region between the first cell row and the second cell row.

According to the above mode, the plurality of I/O cells placed in the I/O region include the first and second cell rows each constituted by I/O cells arranged in the first direction. The first and second cell rows are spaced from each other by a predetermined distance. A reinforcing power supply pad is placed in a region between the first and second cell rows. The reinforcing power supply pad is not connected with the I/O cells but is connected with a cell connecting pad used for power supply. In this way, pads for power supply can be additionally provided without increase in the area of the semiconductor chip.

Also, by placing the reinforcing power supply pad in the region between the first and second cell rows, the inductance and impedance of power supply can be reduced without increase in the number of power supply cells. It is therefore possible to reduce the number of I/O cells for power supply and the number of cell connecting pads used for power supply. In this way, reduction in the area of the semiconductor chip can be achieved.

Thus, by effectively using dead space produced when I/O cell rows are separated from each other, reduction in the area of a semiconductor integrated circuit can be achieved.

According to the present disclosure, reduction in the area of a semiconductor chip can be achieved by effectively using dead space produced when I/O cell rows are separated from each other.

DETAILED DESCRIPTION

First Embodiment

Figure 1:
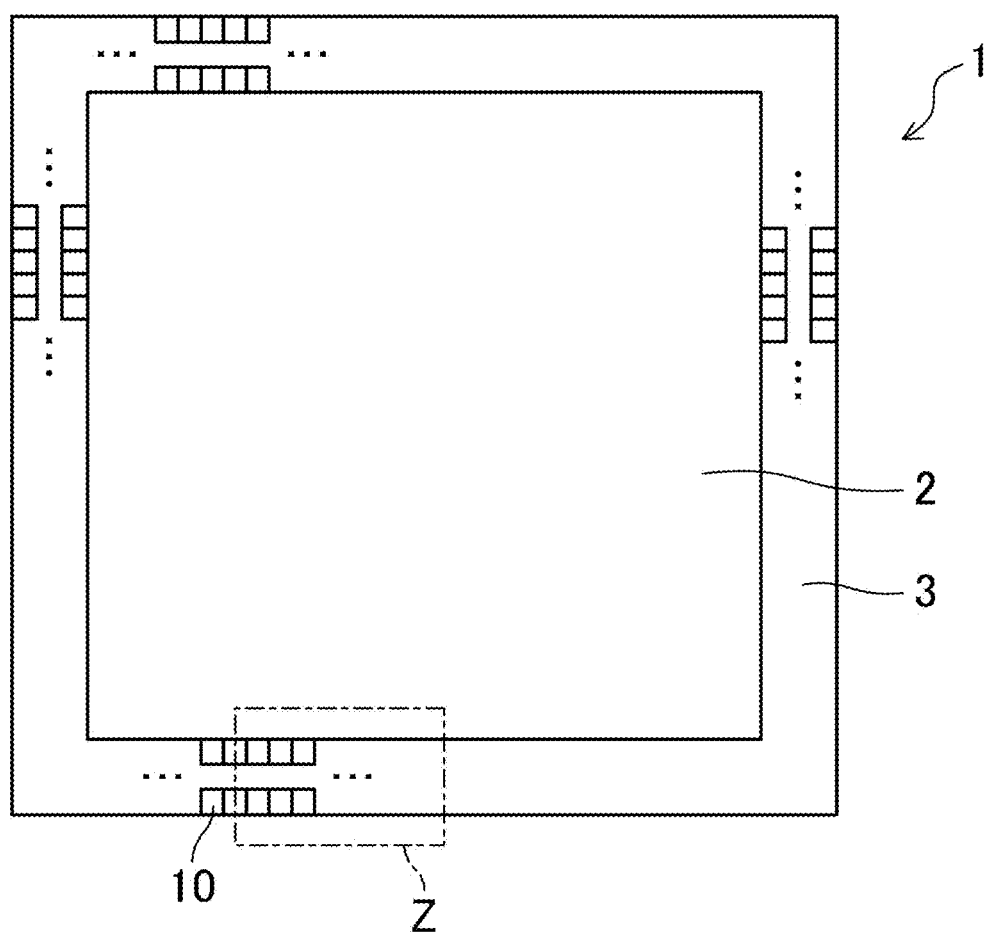
FIG. 1 is a plan view schematically showing the entire configuration of a semiconductor chip according to an embodiment.

FIG. 1 is a plan view schematically showing the entire configuration of a semiconductor chip according to an embodiment. The semiconductor chip 1 shown in FIG. 1 includes: a core region 2 in which internal circuits are formed; and an I/O region 3 provided around the core region 2, in which interface circuits (I/O circuits) are formed. Although illustration is simplified in FIG. 1, in the I/O region 3, a plurality of I/O cells 10 constituting the I/O circuits are arranged to line up along the periphery of the semiconductor chip 1. Note that, while the I/O region 3 is formed all around the core region 2 in FIG. 1, it may be formed around a part of the periphery of the core region 2. In other words, the I/O region 3 lies between the core region 2 and the periphery of the semiconductor chip 1. Also, although illustration is omitted in FIG. 1, in the semiconductor chip 1, provided are a plurality of external connecting pads 12 (hereinafter simply called pads as appropriate) for connecting the semiconductor chip 1 with the outside. The external connecting pads 12 are provided in the I/O region 3 and a part of the core region 2.

Figure 2:
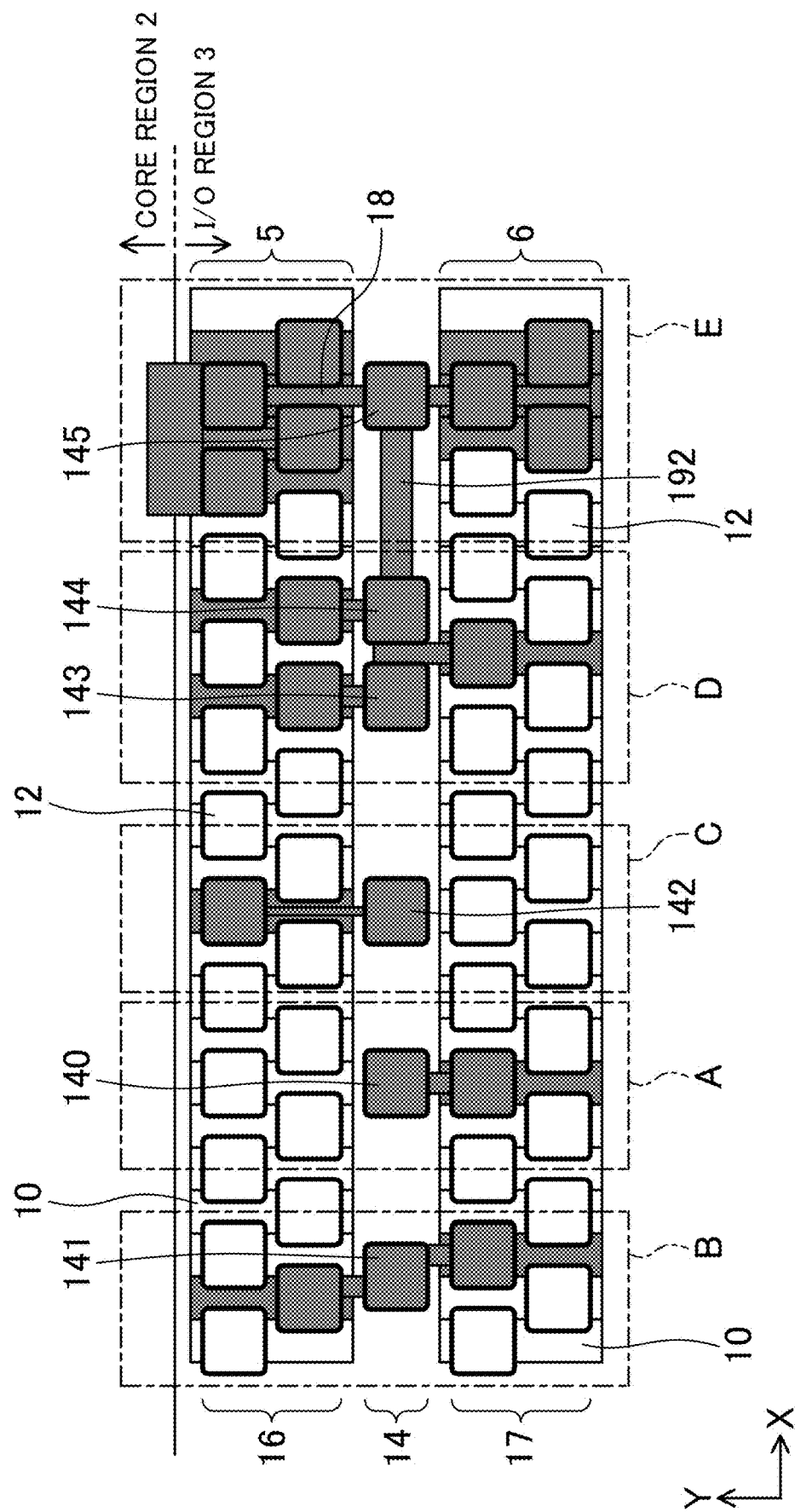
FIG. 2 shows an example of pad arrangement in a semiconductor chip according to the first embodiment.

FIG. 2 is a view showing an example of pad arrangement in a semiconductor chip according to the first embodiment, which corresponds to an enlarged view of part Z in FIG. 1. In FIG. 2, in the I/O region 3, a plurality of I/O cells 10 and a plurality of external connecting pads 12 are arranged in the X direction corresponding to the first direction (the horizontal direction as viewed in the figure; the direction along the periphery of the semiconductor chip). Each of the I/O cells 10 is connected with any of the pads 12 arranged in the I/O region 3.

Note that, as used herein, pads connected to the same node refer to pads that supply the same potential to, or receive/output the same signal from/to, a circuit in the semiconductor chip 1. For example, such pads connected to the same node include power supply pads that supply the same power supply potential, ground pads that supply the ground potential, signal pads that receive a common signal, signal pads that output a common signal, and signal pads that give the same bias potential.

Figure 3:
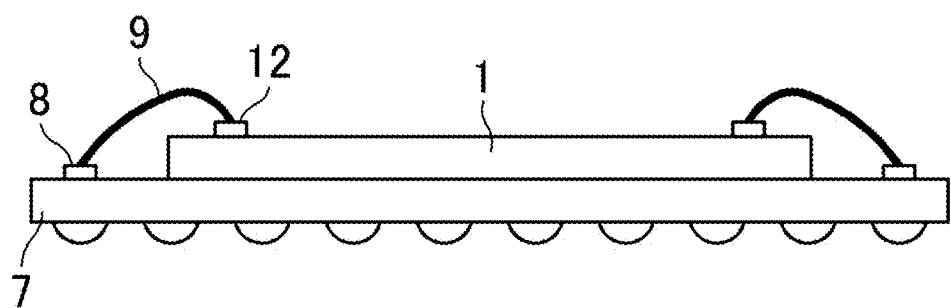
FIG. 3 is a cross-sectional view schematically showing a configuration example of a semiconductor device in which a semiconductor chip is mounted.

FIG. 3 is a cross-sectional view schematically showing a configuration example of a semiconductor device in which the semiconductor chip 1 is mounted. The configuration of FIG. 3 is an example of a ball grid array (BGA) package. The semiconductor chip 1 is mounted on the principal surface of a package substrate 7. Fingers 8 for bonding are provided around the semiconductor chip 1 on the principal surface of the package substrate 7. The external connecting pads 12 of the semiconductor chip 1 are connected with the fingers 8 provided on the package substrate 7 through bonding wires 9.

Returning back to FIG. 2, the plurality of I/O cells 10 include a first cell row 5 and a second cell row 6: the first and second cell rows 6 and 7 are each constituted by I/O cells 10 arranged in the X direction. The first cell row 5 is spaced from the second cell row 6 by a predetermined distance in the Y direction corresponding to the second direction (the vertical direction as viewed in the figure; the direction perpendicular to the first direction). Also, the I/O cells 10 belonging to the second cell row 6 are opposed to the corresponding I/O cells 10 belonging to the first cell row 5 in the Y direction. In FIG. 2, the first cell row 5 is placed closer to the core region 2 than the second cell row 6 (i.e., placed in the upper part of FIG. 2).

The plurality of external connecting pads 12 include a first pad group 16 and a second pad group 17. The first pad group 16 is constituted by pads 12 connected with the I/O cells 10 in the first cell row 5 and is placed above the first cell row 5. The second pad group 17 is constituted by pads 12 connected with the I/O cells 10 in the second cell row 6 and is placed above the second cell row 6. Therefore, the first pad group 16 is spaced from the second pad group 17 in the Y direction. The pads 12 belonging to the first and second pad groups 16 and 17 correspond to the cell connecting pads.

In each of the first and second pad groups 16 and 17, the pads 12 are arranged in the X direction in two rows lying side by side in the Y direction, and the pads in two rows are placed in a staggered pattern.

The plurality of external connecting pads 12 also include a plurality of reinforcing power supply pads 14. The reinforcing power supply pads 14 are arranged in the X direction between the first pad group 16 and the second pad group 17. Each of the reinforcing power supply pads 14 is placed so that the center thereof is located between the first cell row 5 and the second cell row 6. In FIG. 2, the reinforcing power supply pad 14 has no overlap with any of the I/O cells 10 belonging to the first and second cell rows 5 and 6 as viewed in plan. Note however that the reinforcing power supply pad 14 may be located at its enter between the first and second cell rows 5 and 6 and yet may have an overlap with an I/O cell 10. The reinforcing power supply pad 14 is not directly connected with any of the I/O cells 10 in the first and second cell rows 5 and 6.

<Part A>

Figure 4:
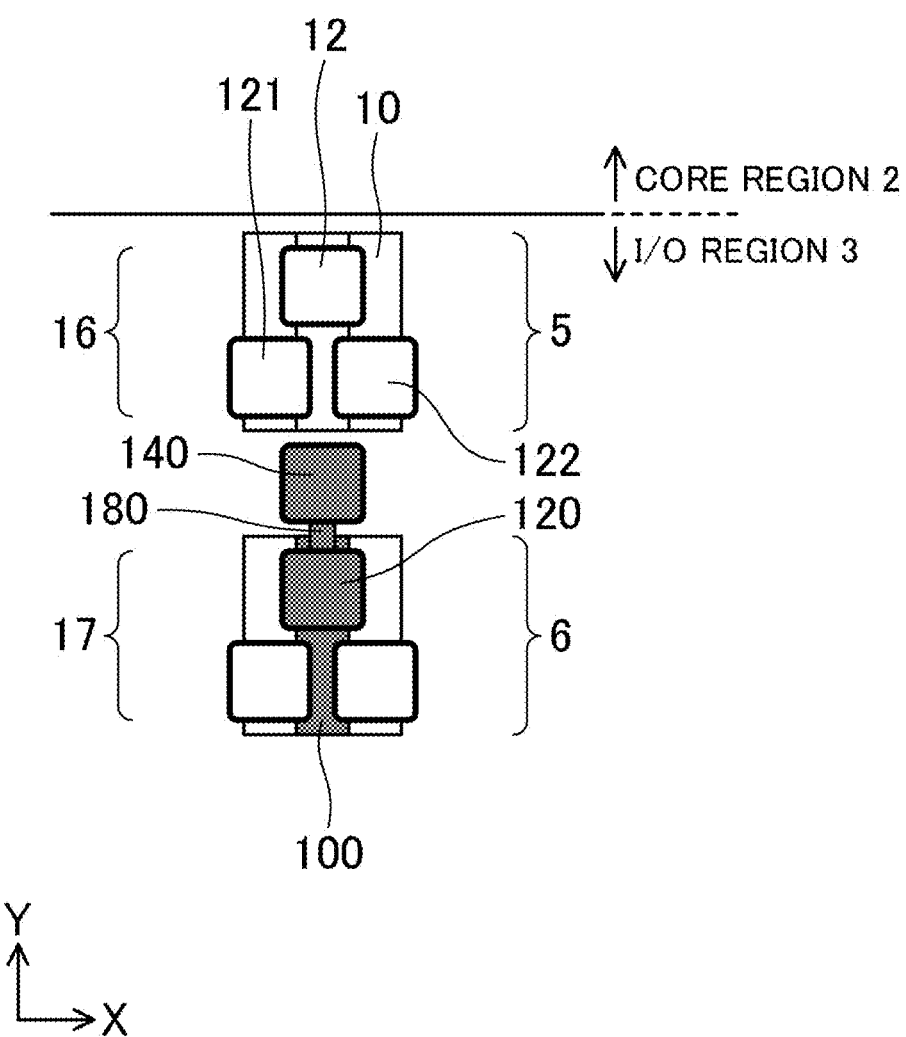
FIG. 4 is an enlarged view of pad arrangement in part A in FIG. 2.

FIG. 4 is an enlarged view of part A in FIG. 2. In FIG. 4, power is supplied from the same node to the portion filled with gray. An I/O cell 100 is a power supply cell for supplying power to a semiconductor integrated circuit. A pad 120, connected with the outside of the semiconductor chip 1, is connected with the I/O cell 100 through a means not shown for supplying power to the I/O cell 100. A reinforcing power supply pad 140, connected with the outside of the semiconductor chip 1 to receive power, is placed at the same position as the pad 120 in the X direction and connected with the pad 120 through an interconnect 180. The reinforcing power supply pad 140 is placed at a position where the center-to-center distance from the pad 120 is shorter than the center-to-center distance from any pad (a pad 121 or a pad 122 of which the distance is shortest in FIG. 4) belonging to the first pad group 16. Also, the reinforcing power supply pad 140 is not connected with any pad 12 belonging to the first pad group 16.

Figure 5:
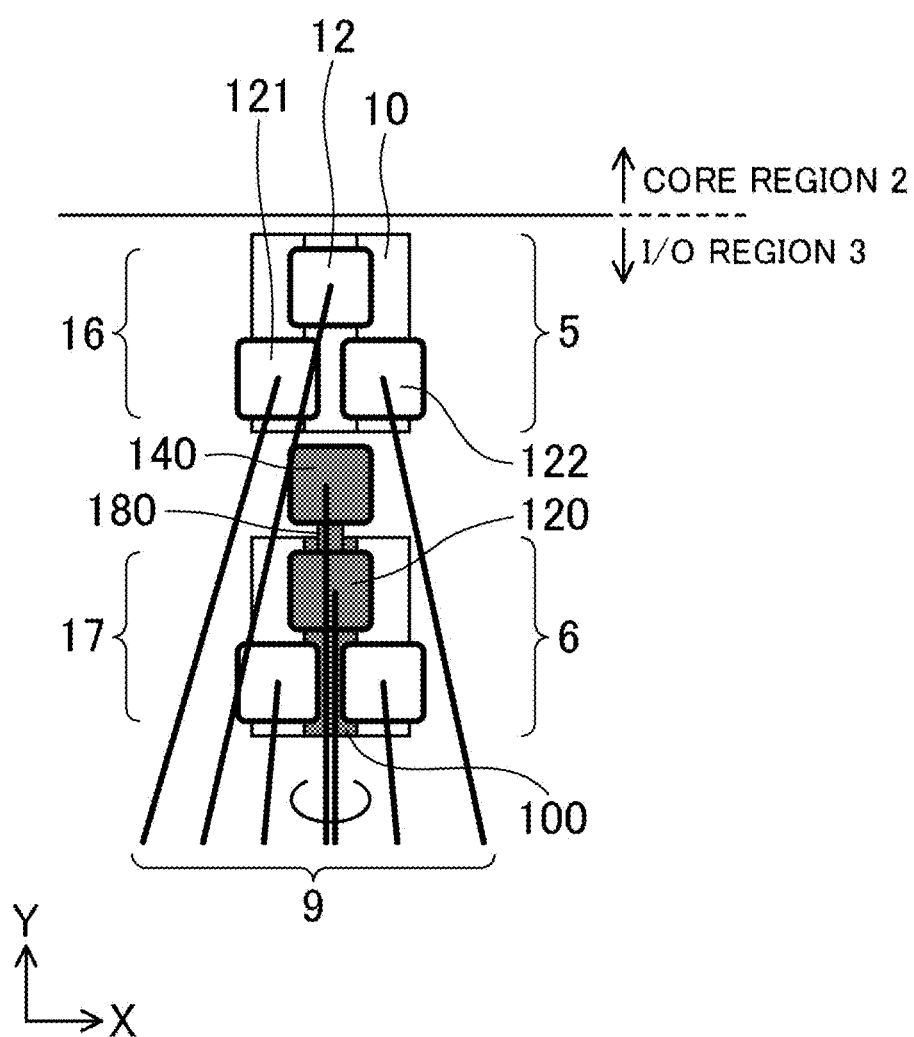
FIG. 5 shows a configuration example of the pads in FIG. 4 connected with bonding wires.

FIG. 5 is a view showing a state where the pads are connected with bonding wires in the configuration of FIG. 4. The pads 12 are connected with bonding wires 9, and then connected with the fingers 8 for bonding (not shown) placed in a lower part as viewed in the figure through the bonding wires 9. The pads 12 are connected to the same node or different nodes from one another, although the pad 120 and the reinforcing power supply pad 140 are connected to the same node.

The pad 120 and the reinforcing power supply pad 140 are displaced in the X direction from the pads 121 and 122 placed nearest to the reinforcing power supply pad 140 among the pads 12 belonging to the first pad group 16. This prevents the bonding wires 9 connected to the pad 120 and the reinforcing power supply pad 140 from being shorted with the bonding wires 9 connected to the pads 121 and 122. On the other hand, there is a possibility that the bonding wires 9 connected to the pad 120 and the reinforcing power supply pad 140, placed at the same position in the X direction, may be shorted with each other. However, even if the bonding wires 9 connected to the pad 120 and the reinforcing power supply pad 140 are shorted with each other, no problem will arise because these pads are connected to the same node. Rather, with the shorting of the bonding wires 9 connected to these pads, the inductance value and impedance value of the bonding wires 9 decrease, resulting in reducing or preventing problems of an IR-drop of power supply (a power supply voltage drop), electromigration (EM) for power supply, and simultaneous switching output noise.

The pad 120 and the reinforcing power supply pad 140 do not need to be placed at exactly the same position in the X direction. It is however preferable for the reinforcing power supply pad 140 to be placed at a position nearer to the pad 120 than the pad 121 or 122 in the X direction.

The pad 120, the reinforcing power supply pad 140, and the interconnect 180 may be formed in the same wiring layer, or in different wiring layers from one another.

<Part B>

Figure 6:
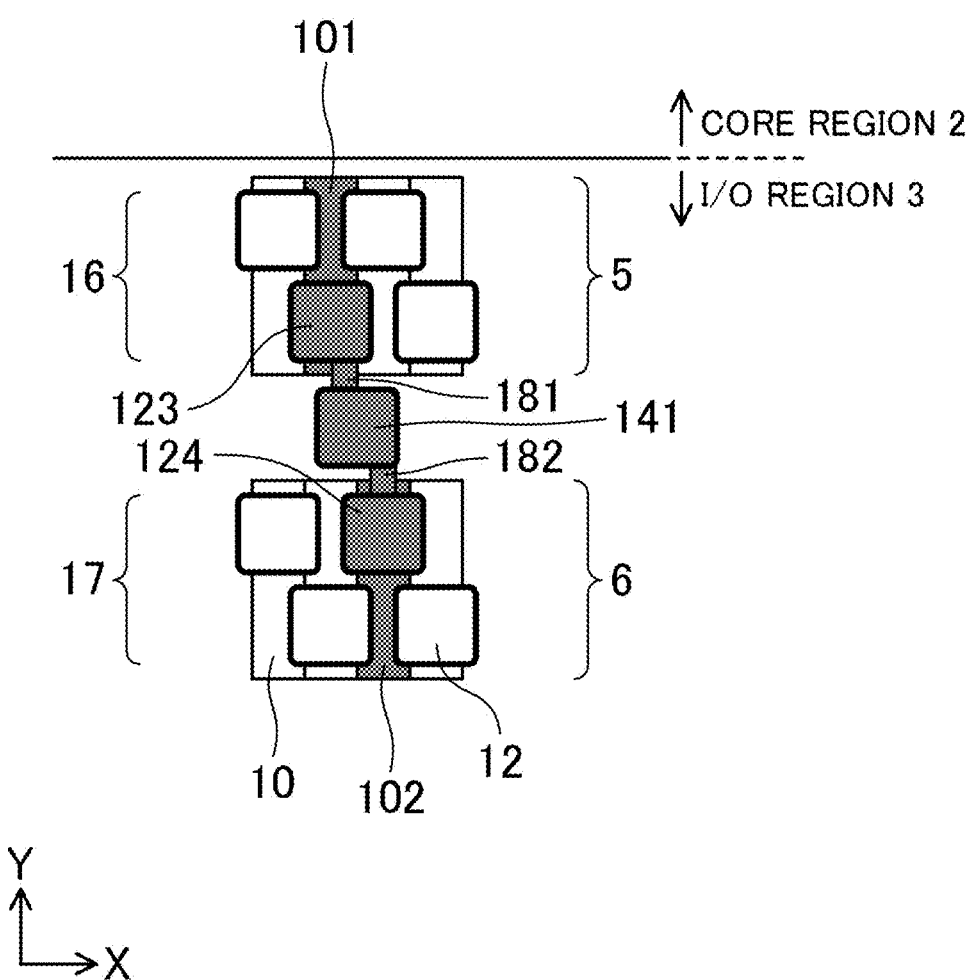
FIG. 6 is an enlarged view of pad arrangement in part B in FIG. 2.

FIG. 6 is an enlarged view of part B in FIG. 2. In FIG. 6, power is supplied from the same node to the portion filled with gray. I/O cells 101 and 102 are power supply cells for supplying power to a semiconductor integrated circuit. A pad 123, belonging to the first pad group 16, is a power supply pad connected with the I/O cell 101 through a means not shown for supplying power to the I/O cell 101. A pad 124, belonging to the second pad group 17, is a power supply pad connected with the I/O cell 102 through a means not shown for supplying power to the I/O cell 102. A reinforcing power supply pad 141 is connected with the pad 123 through an interconnect 181 and connected with the pad 124 through an interconnect 182. The reinforcing power supply pad 141 is placed at a position between the pad 123 and the pad 124 in the X direction.

In FIG. 6, also, the pads 12 are connected with fingers 8 for bonding through bonding wires 9 not shown, as in FIG. 5. The pads 12 are connected to the same node or different nodes from one another, although the pads 123 and 124 and the reinforcing power supply pad 141 are connected to the same node.

Since the reinforcing power supply pad 141 is placed between the pad 123 and the pad 124 in the X direction, there is a possibility that the bonding wires 9 connected to the pads 123 and 124 and the reinforcing power supply pad 141 may be shorted with each other. However, with the pads 123 and 124 and the reinforcing power supply pad 141 being connected to the same node, no problem will arise even if the bonding wires 9 connected to these pads are shorted with each other. Rather, with the shorting of the bonding wires 9 connected to these pads, the inductance value and impedance value of the bonding wires 9 decrease, resulting in reducing or preventing problems of an IR-drop of power supply (a power supply voltage drop), EM for power supply, and simultaneous switching output noise.

In FIG. 6, the pads 123 and 124, the reinforcing power supply pad 141, and the interconnects 181 and 182 may be formed in the same wiring layer, or in different wiring layers from one another.

<Part C>

Figure 7:
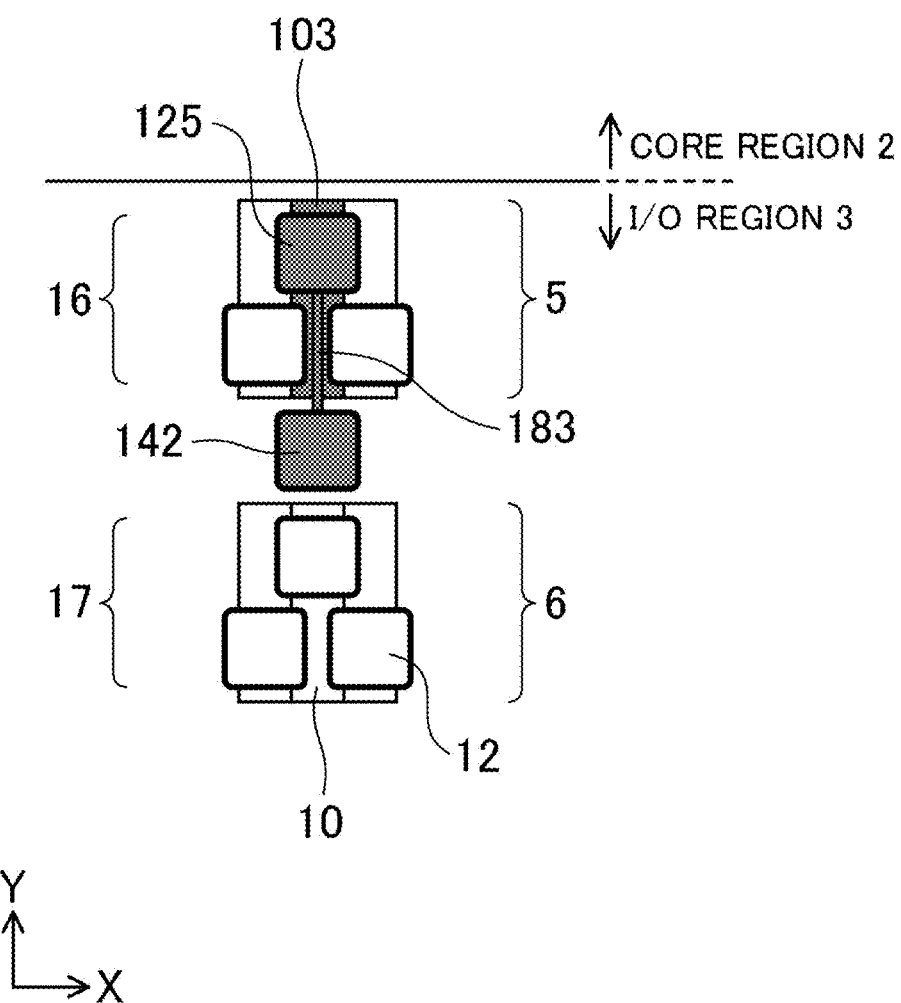
FIG. 7 is an enlarged view of pad arrangement in part C in FIG. 2.

FIG. 7 is an enlarged view of part C in FIG. 2. In FIG. 7, power is supplied from the same node to the portion filled with gray. An I/O cell 103 is a power supply cell for supplying power to a semiconductor integrated circuit. A pad 125, belonging to the first pad group 16, is a power supply pad connected with the I/O cell 103 through a means not shown for supplying power to the I/O cell 103. A reinforcing power supply pad 142 is connected with the pad 125 belonging to the first pad group 16 through an interconnect 183, and is placed at the same position as the pad 125 in the X direction. The reinforcing power supply pad 142 is not connected with any pad 12 belonging to the second pad group 17.

In FIG. 7, also, the pads 12 are connected with fingers 8 for bonding through bonding wires 9 not shown, as in FIG. 5. The pads 12 are connected to the same node or different nodes from one another, although the pad 125 and the reinforcing power supply pad 142 are connected to the same node.

Since the reinforcing power supply pad 142 is placed at the same position as the pad 125 in the X direction, there is a possibility that the bonding wires 9 connected to the pad 125 and the reinforcing power supply pad 142 may be shorted with each other. However, with the pad 125 and the reinforcing power supply pad 142 being connected to the same node, no problem will arise even if the bonding wires 9 connected to these pads are shorted with each other. Rather, with the shorting of the bonding wires 9 connected to these pads, the inductance value and impedance value of the bonding wires 9 decrease, resulting in reducing or preventing problems of an IR-drop of power supply (a power supply voltage drop), EM for power supply, and simultaneous switching output noise.

In FIG. 7, the pad 125 and the reinforcing power supply pad 142 are not necessarily required to be placed at the same position in the X direction.

Also, the pad 125, the reinforcing power supply pad 142, and the interconnect 183 may be formed in the same wiring layer, or in different wiring layers from one another.

<Part D>

Figure 8:
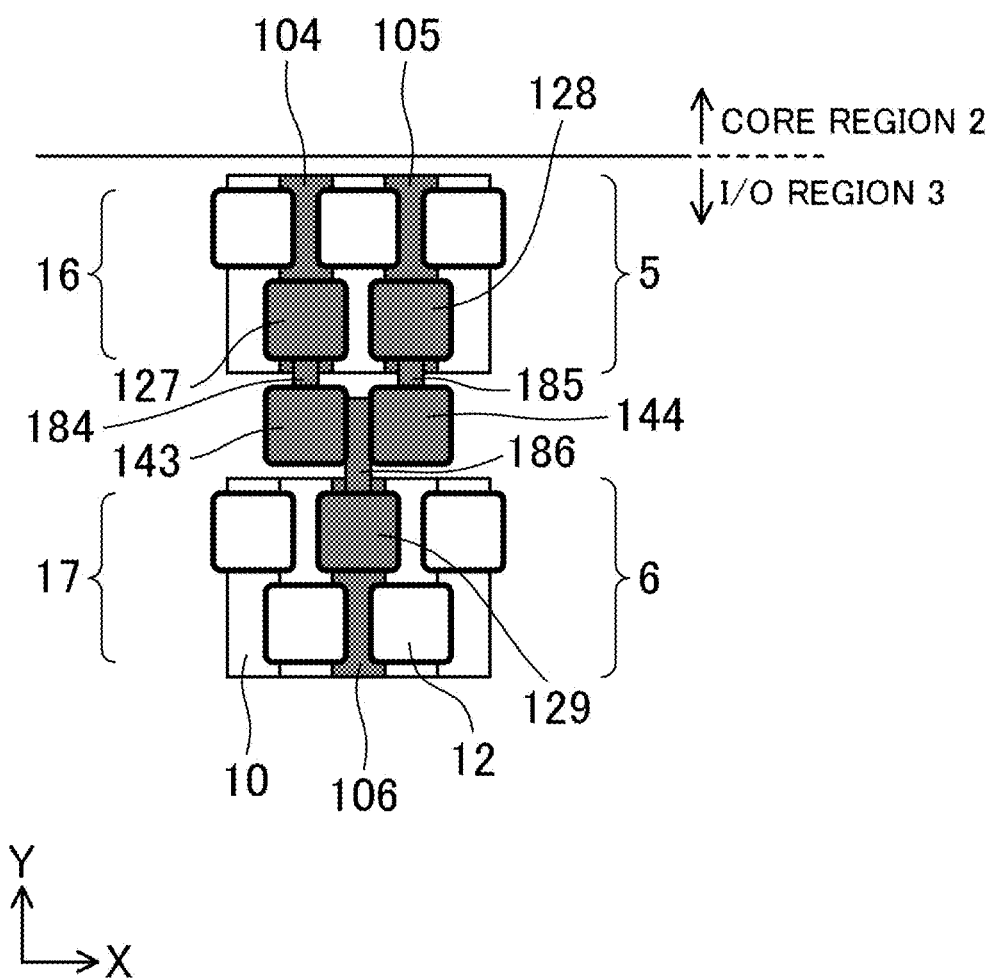
FIG. 8 is an enlarged view of pad arrangement in part D in FIG. 2.

FIG. 8 is an enlarged view of part D in FIG. 2. In FIG. 8, power is supplied from the same node to the portion filled with gray. I/O cells 104 to 106 are power supply cells for supplying power to the semiconductor chip 1. Pads 127 to 129 are power supply pads respectively connected to the I/O cells 104 to 106 through a means not shown for supplying power to these I/O cells. In FIG. 8, the pads 127 and 128 belong to the first pad group 16 and the pad 129 belongs to the second pad group 17. The pad 129 is placed between the pad 127 and the pad 128 in the X direction.

Reinforcing power supply pads 143 and 144 are placed side by side in the X direction in the region between the first cell row 5 and the second cell row 6. The reinforcing power supply pad 143 is connected with the pad 127 through an interconnect 184, and the reinforcing power supply pad 144 is connected with the pad 128 through an interconnect 185. The reinforcing power supply pad 143 is located at the same position as the pad 127 in the X direction, and the reinforcing power supply pad 144 is located at the same position as the pad 128 in the X direction. Further, the pad 129 and the reinforcing power supply pads 143 and 144 are mutually connected through an interconnect 186. That is, the reinforcing power supply pads 143 and 144 are placed side by side in the X direction and mutually connected through the interconnect.

In FIG. 8, also, the pads 12 are connected with fingers 8 for bonding through bonding wires 9 not shown, as in FIG. 5, and connected to the same node or different nodes from one another, although the pads 127 to 129 and the reinforcing power supply pads 143 and 144 are connected to the same node.

The reinforcing power supply pad 143 is placed at the same position as the pad 127 in the X direction, and the reinforcing power supply pad 144 is placed at the same position as the pad 128 in the X direction. Also, the reinforcing power supply pads 143 and 144 and the pad 129 are placed close to one another in the X direction. Therefore, there is a possibility that bonding wires 9 connected to the pads 127 to 129 and the reinforcing power supply pads 143 and 144 may touch one another causing shorting. However, with the pads 127 to 129 and the reinforcing power supply pads 143 and 144 being connected to the same node, no problem will arise even if the bonding wires 9 connected to these pads are shorted with one another. Rather, with the shorting of the bonding wires 9, the inductance value and impedance value of the bonding wires 9 decrease, resulting in reducing or preventing problems of an IR-drop of power supply, EM for power supply, and simultaneous switching output noise.

In FIG. 8, the pad 127 and the reinforcing power supply pad 143, and the pad 128 and the reinforcing power supply pad 144, do not need to be placed at the same position in the X direction. It is however preferable for the reinforcing power supply pads 143 and 144 to be placed between the pads 127 and 128 in the X direction.

Also, the pads 127 to 129, the reinforcing power supply pads 143 and 144, and the interconnects 184 to 186 may be formed in the same wiring layer, or in different wiring layers from one another.

<Part E>

Figure 9:
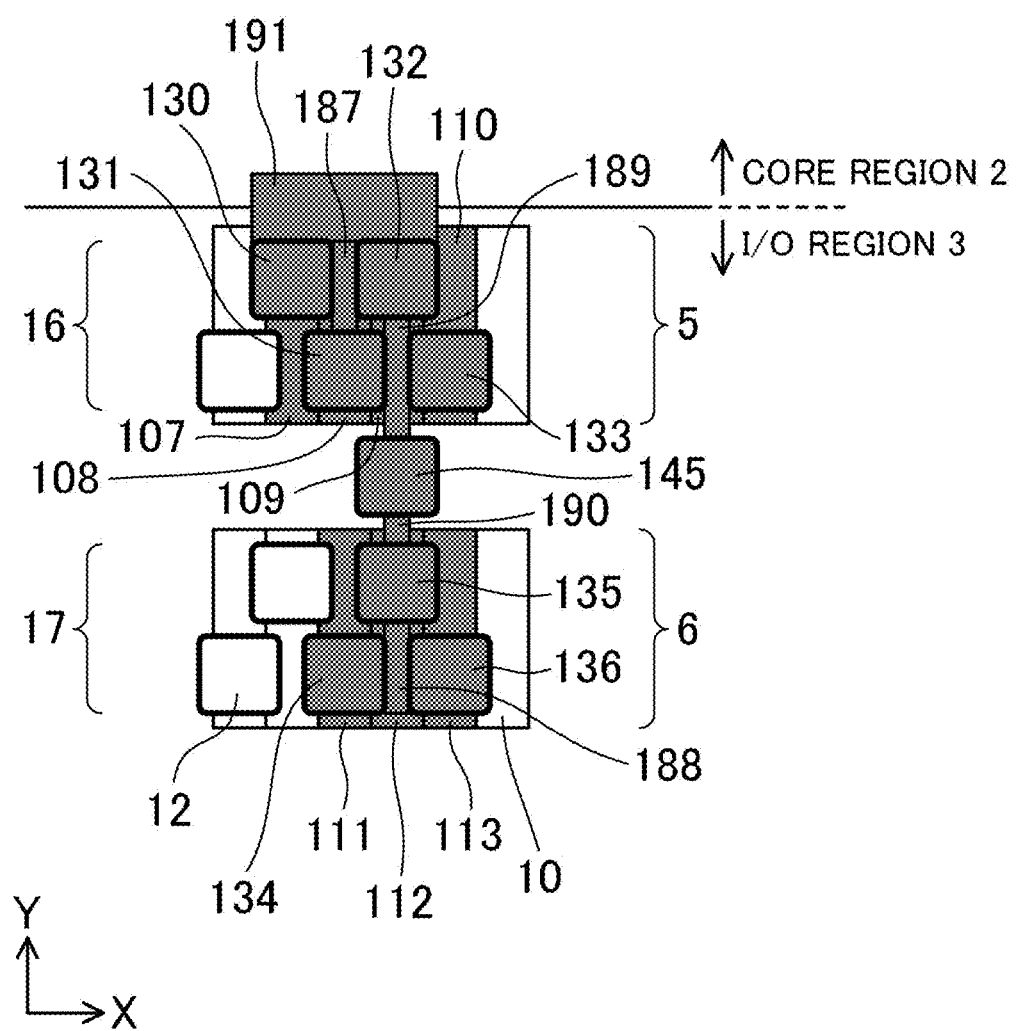
FIG. 9 is an enlarged view of pad arrangement in part E in FIG. 2.

FIG. 9 is an enlarged view of part E in FIG. 2. Power is supplied from the same node to the portion filled with gray. I/O cells 107 to 113 are power supply cells for supplying power to a semiconductor integrated circuit. The I/O cells 107 to 110 belong to the first cell row 5 and are arranged adjacently in the X direction. The I/O cells 111 to 113 belong to the second cell row 6 and are arranged adjacently in the X direction. Pads 130 to 136 are power supply pads respectively connected to the I/O cells 107 to 113 through a means not shown for supplying power to these I/O cells.

A reinforcing power supply pad 145 is placed at the same position as the pad 132 in the X direction. The pads 130 to 132 are mutually connected through an interconnect 187, and the pads 134 to 136 are mutually connected through an interconnect 188. The pads 131 to 133 and the reinforcing power supply pad 145 are mutually connected through an interconnect 189, and the pad 135 and the reinforcing power supply pad 145 are mutually connected through an interconnect 190. That is, the pads 130 to 136 and the reinforcing power supply pad 145 are mutually connected through the interconnects 187 to 190. The interconnect 187 is connected with an interconnect 191, so that power is supplied into the core region 2 through the interconnect 191.

In FIG. 9, also, the pads 12 are connected with fingers 8 for bonding through bonding wires 9 not shown, as in FIG. 5, and connected to the same node or different nodes from one another, although the pads 130 to 136 and the reinforcing power supply pad 145 are connected to the same node.

The reinforcing power supply pad 145 is placed at the same position as the pad 132 in the X direction. Therefore, there is a possibility that the bonding wires 9 connected to the pad 132 and the reinforcing power supply pad 145 may touch each other causing shorting. Also, since the pads 130 to 136 and the reinforcing power supply pad 145 are placed close to one another in the X direction, there is a possibility that the bonding wires 9 connected to the pads 130, 131, and 133 to 136 and the reinforcing power supply pad 145 may touch each other causing shorting. However, with the pads 130 to 136 and the reinforcing power supply pad 145 being connected to the same node, no problem will arise even if the bonding wires 9 connected to these pads are shorted with one another. Rather, with the shorting of the bonding wires 9 connected to the pads 130 to 136 and the reinforcing power supply pad 145, the inductance value and impedance value of the bonding wires 9 decrease, resulting in reducing or preventing problems of an IR-drop of power supply, EM for power supply, and simultaneous switching output noise.

Moreover, since the pads 130 to 136 and the reinforcing power supply pad 145 are connected to the same node and the pads 130 to 136 are placed close to one another in the X direction, the design freedom of the bonding wires 9 increases. Also, since the number of pads connected to the same node is large, problems of an IR-drop of power supply, EM for power supply, and simultaneous switching output noise are further reduced or prevented.

In FIG. 9, the reinforcing power supply pad 145 and the pad 132 are not necessarily required to be placed at the same position in the X direction. It is however preferable for the reinforcing power supply pad 145 to be placed within a range where the pads 130 to 136 are placed in the X direction.

The pads 130 to 136, the reinforcing power supply pad 145, and the interconnects 187 to 191 may be formed in the same wiring layer, or in different wiring layers from one another.

Also, as shown in FIG. 2, when the node connected to the pads 130 to 136 and the reinforcing power supply pad 145 is the same as the node connected to the pads 127 to 129 and the reinforcing power supply pads 143 and 144, the reinforcing power supply pads 144 and 145 may be connected through an interconnect 192. This can further reduce or prevent the problems of an IR-drop of power supply, EM for power supply, and simultaneous switching output noise.

As described above, according to this embodiment, the first and second cell rows 5 and 6, each constituted by I/O cells 10 arranged in the X direction, are placed in the I/O region 3. The first and second cell rows 5 and 6 are spaced from each other by a predetermined distance. In the region between the first and second cell rows 5 and 6, the reinforcing power supply pads 14 are placed. The reinforcing power supply pads 14 are not connected with the I/O cells 10 but are connected with the pads 12 used for power supply. In this way, pads for power supply can be additionally provided without increase in the area of the semiconductor chip 1.

Also, by placing the reinforcing power supply pads 14 in the region between the first cell row 5 and the second cell row 6, the inductance and impedance of power supply can be reduced without increase in the number of power supply cells. It is therefore possible to reduce the number of power supply cells in the first and second cell rows 5 and 6 and the number of power supply pads in the first and second pad groups 16 and 17. In this way, reduction in the area of the semiconductor chip 1 can be achieved.

Note that the node connected to the pad 120 and the reinforcing power supply pad 140 in part A, the node connected to the pads 123 and 124 and the reinforcing power supply pad 141 in part B, the node connected to the pad 125 and the reinforcing power supply pad 142 in part C, the node connected to the pads 127 to 129 and the reinforcing power supply pads 143 and 144 in part D, and the node connected to the pads 130 to 136 and the reinforcing power supply pad 145 in part E may be the same or different from one another.

Figure 10:
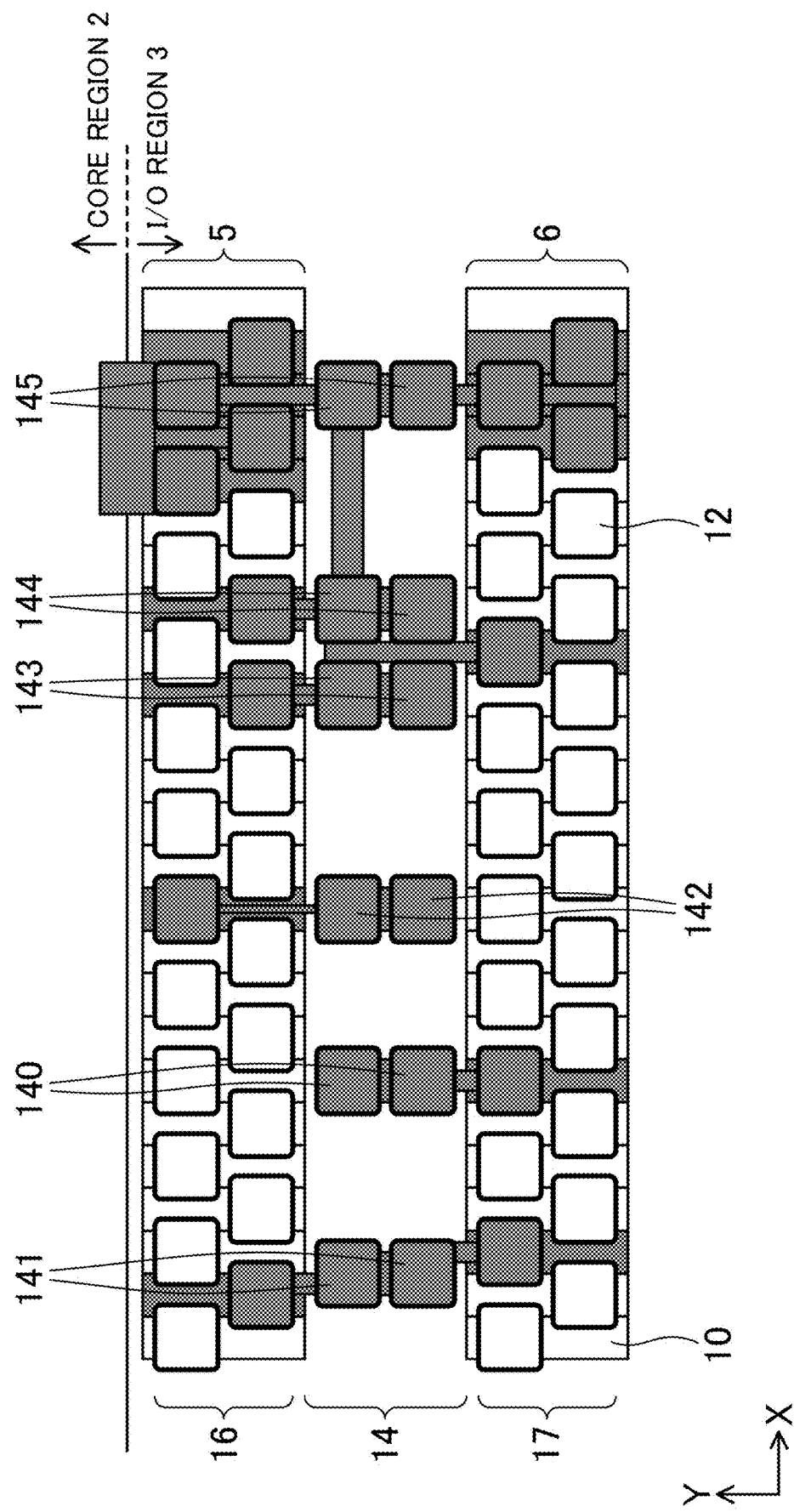
FIG. 10 shows another example of pad arrangement in the first embodiment.

FIG. 10 is another example of pad arrangement in this embodiment. The configuration of FIG. 10 is basically the same as that of FIG. 2, except that the reinforcing power supply pads 140 to 145 are each constituted by two pads arranged side by side in the Y direction, and such two pads each of the reinforcing power supply pads 140 to 145 are mutually connected through an interconnect.

With the above placement, similar effects to those in the configuration of FIG. 2 can be obtained. Also, with the increase in the number of reinforcing power supply pads 14 placed in the region between the first and second cell rows 5 and 6, the number of pads connected to the same node can be increased. This makes it possible to reduce the inductance and impedance of power supply, and thus further reduce or prevent the problems of an IR-drop of power supply, EM for power supply, and simultaneous switching output noise.

Note that the reinforcing power supply pads 140 to 145 may be each constituted by three or more pads arranged side by side in the Y direction, and such three or more pads may be mutually connected.

Second Embodiment

Figure 11:
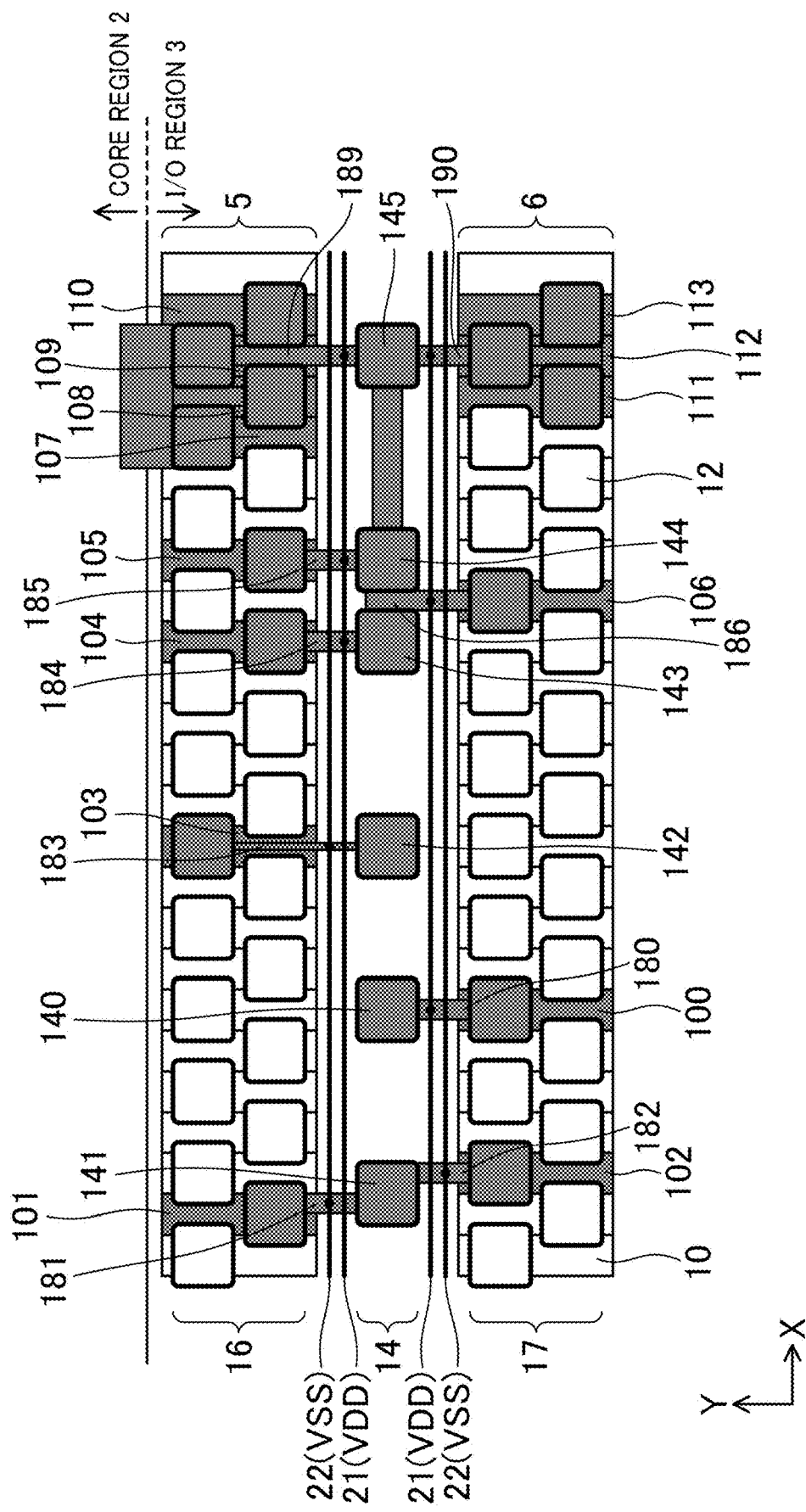
FIG. 11 shows an example of pad arrangement in a semiconductor chip according to the second embodiment.

FIG. 11 is a view showing an example of pad arrangement in a semiconductor chip according to the second embodiment. In FIG. 11, power VDD is supplied to the I/O cells 100 and 104 to 113 through the corresponding pads 12, and power VSS is supplied to the I/O cells 101 to 103 through the corresponding pads 12.

The configuration of FIG. 11 is basically the same as that of FIG. 2, except that a plurality of reinforcing power supply lines are formed to extend in the X direction in the region between the first cell row 5 and the second cell row 6. More specifically, reinforcing power supply lines 21 for supply of VDD and reinforcing power supply lines 22 for supply of VSS are formed in a region between the reinforcing power supply pads 14 and the first cell row 5 and in a region between the reinforcing power supply pads 14 and the second cell row 6. In FIG. 11, the reinforcing power supply lines 21 are formed closer to the reinforcing power supply pads 14 than the reinforcing power supply lines 22.

The reinforcing power supply lines 21 are connected with the interconnects 180, 184 to 186, 189, and 190 through vias, and the reinforcing power supply lines 22 are connected with the interconnects 181 to 183 through vias.

According to this embodiment, similar effects to those in the first embodiment can be obtained. In addition, a plurality of power supply pads and reinforcing power supply pads can be connected through the reinforcing power supply lines 21 and 22, whereby power can be supplied to the I/O cells 10 stably with low resistance. Also, the number of power supply cells provided to deal with ESD-caused restrictions can be reduced.

The reinforcing power supply lines 21 and 22, the pads 12, and the reinforcing power supply pads 14 may be formed in the same wiring layer, or in different wiring layers from one another. Note however that the interconnects 180 to 186, 189, and 190 and the reinforcing power supply lines 21 and 22 are placed in different wiring layers from each other to avoid shorting.

The reinforcing power supply lines 21 and 22 may be formed in only either the region between the reinforcing power supply pads 14 and the first cell row 5 or the region between the reinforcing power supply pads 14 and the second cell row 6. Also, only either the reinforcing power supply lines 21 or 22 may be formed in the region between the reinforcing power supply pads 14 and the first cell row 5 and the region between the reinforcing power supply pads 14 and the second cell row 6. Further, the reinforcing power supply lines 22 may be placed closer to the reinforcing power supply pads 14 than the reinforcing power supply lines 21.

Figure 12:
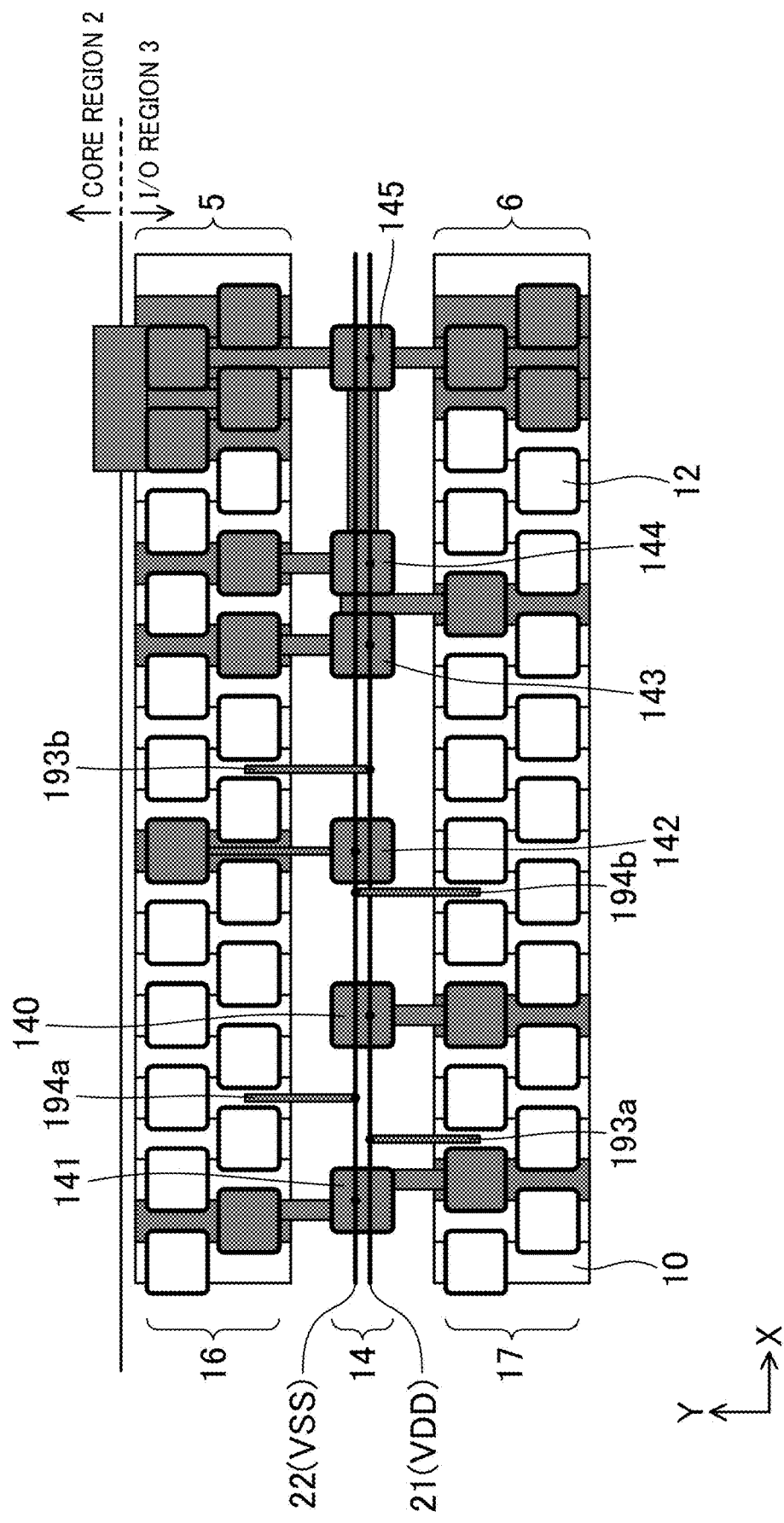
FIG. 12 shows another example of pad arrangement in the second embodiment.

FIG. 12 is another example of pad arrangement in this embodiment. The configuration of FIG. 12 is basically the same as that of FIG. 11, except that the reinforcing power supply lines 21 and 22 are placed to overlap the reinforcing power supply pads 14 as viewed in plan. The reinforcing power supply line 21 is connected with the reinforcing power supply pads 140 and 143 to 145 through vias, and the reinforcing power supply line 22 is connected with the reinforcing power supply pads 141 and 142 through vias.

With the above placement, similar effects to those in the first embodiment can be obtained. In addition, power can be supplied to the I/O cells 10 through the reinforcing power supply lines 21 and 22 stably with low resistance. Also, the number of power supply cells provided to deal with ESD-caused restrictions can be reduced.

Note that the reinforcing power supply lines 21 and 22 and the reinforcing power supply pads 14 (reinforcing power supply pads 140 to 145) are placed in different wiring layers from each other to avoid shorting.

As shown in FIG. 12, interconnects 193*a* and 193*b* for connecting the reinforcing power supply line 21 with power supply lines (not shown) in the I/O cells 10 and interconnects 194*a* and 194*b* for connecting the reinforcing power supply line 22 with power supply lines (not shown) in the I/O cells 10 may be provided. This makes it possible to supply power directly from the reinforcing power supply lines 21 and 22 to the I/O cells 10.

Figure 13:
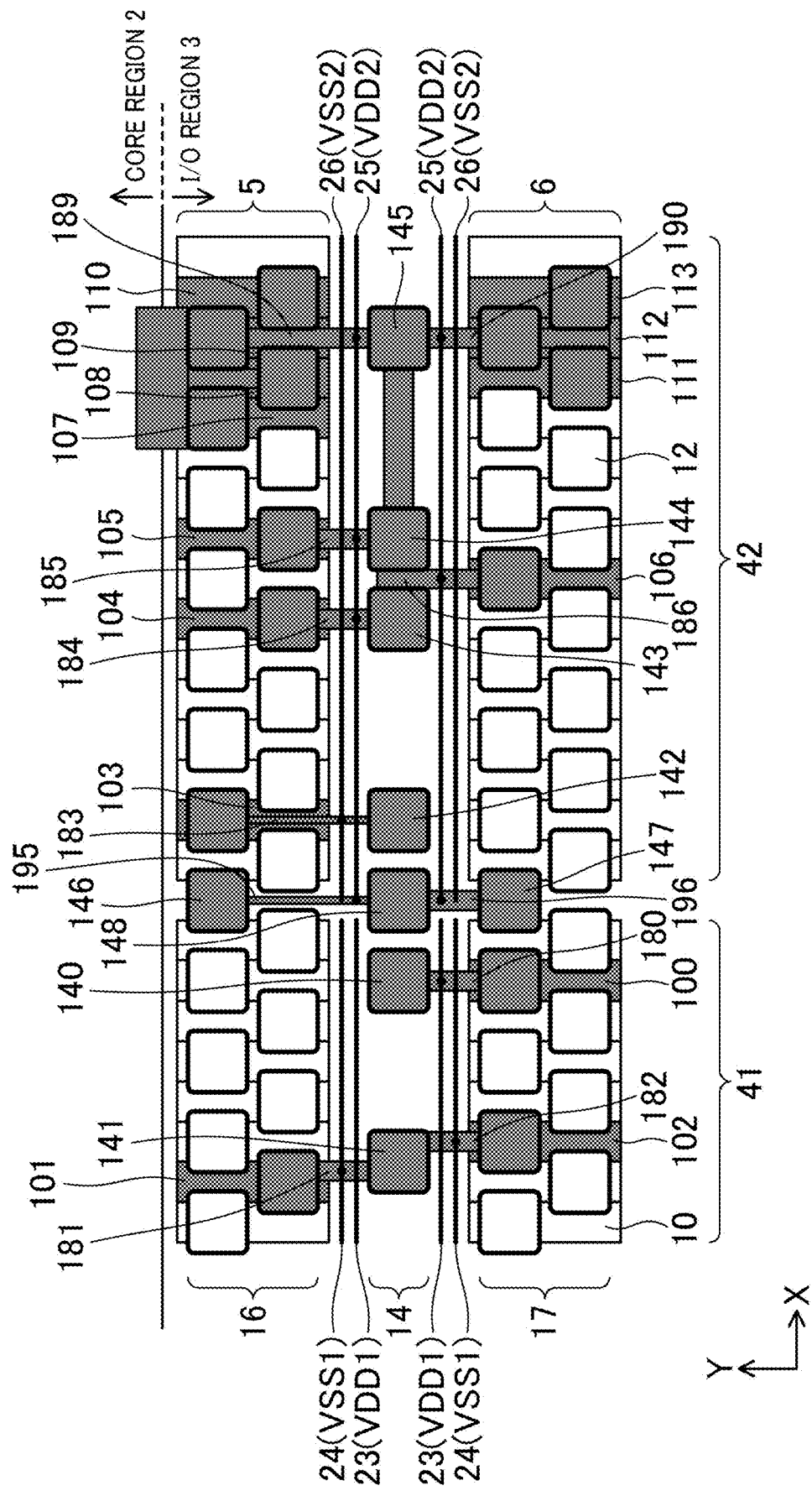
FIG. 13 shows yet another example of pad arrangement in the second embodiment.

FIG. 13 is yet another example of pad arrangement in this embodiment. The configuration of FIG. 13 is basically the same as that of FIG. 11, except that the first cell row 5 and the second cell row 6 are each separated, in the X direction, into a first portion 41 and a second portion 42 that receive different power supplies. That is, VDD1 and VSS1 are supplied to the first portion 41, and VDD2 and VSS2 are supplied to the second portion 42. Also, reinforcing power supply lines 23 to 26 are formed in the region between the first cell row 5 and the second cell row 6.

More specifically, the reinforcing power supply lines 23 and 24 are lines for supplying VDD1 and VSS1, respectively, to the I/O cells 10 placed in the first portion 41. The reinforcing power supply lines 25 and 26 are lines for supplying VDD2 and VSS2, respectively, to the I/O cells 10 placed in the second portion 42.

The reinforcing power supply lines 23 and 24 are formed in a region between the first portion 41 of the first cell row 5 and the reinforcing power supply pads 140 and 141 and a region between the first portion 41 of the second cell row 6 and the reinforcing power supply pads 140 and 141. The reinforcing power supply lines 25 and 26 are formed in a region between the second portion 42 of the first cell row 5 and the reinforcing power supply pads 142 to 145 and a region between the second portion 42 of the second cell row 6 and the reinforcing power supply pads 142 to 145.

The reinforcing power supply lines 23 are connected with the interconnect 180 through a via, and the reinforcing power supply lines 24 are connected with the interconnects 181 and 182 through vias. The reinforcing power supply lines 25 are connected with the interconnects 184 to 186, 189, and 190 through vias, and the reinforcing power supply lines 26 are connected with the interconnect 183 through a via.

A reinforcing power supply pad 146 is placed over a region between the first and second portions 41 and 42 of the first cell row 5, and a reinforcing power supply pad 147 is placed over a region between the first and second portions 41 and 42 of the second cell row 6. Further, a reinforcing power supply pad 148 is placed between the reinforcing power supply pads 146 and 147 so as to lie in line with the reinforcing power supply pads 140 to 145 in the X direction. The reinforcing power supply pads 146 to 148 are not connected to the I/O cells 10 in the first and second cell rows 5 and 6, and are mutually connected through interconnects 195 and 196. The reinforcing power supply pads 146 to 148 are connected with the reinforcing power supply lines 25 through the interconnects 195 and 196.

With the above placement, while similar effects to those in the first embodiment are obtained, power can be supplied to the I/O cells 10 through the reinforcing power supply lines 23 to 26 with low resistance. Also, the number of power supply cells provided to deal with ESD-caused restrictions can be reduced. Moreover, since the dead space in the first and second cell rows 5 and 6 where no I/O cells 10 are placed can also be used effectively, reduction in the area of a semiconductor integrated circuit can be achieved.

The reinforcing power supply pad 146 may overlap an I/O cell 10 in the first cell row 5 as viewed in plan. It should however be ensured that the center of the reinforcing power supply pad 146 lies in the region between the first and second portions 41 and 42 of the first cell row 5. Likewise, the reinforcing power supply pad 147 may overlap an I/O cell 10 in the second cell row 6 as viewed in plan. It should however be ensured that the center of the reinforcing power supply pad 147 lies in the region between the first and second portions 41 and 42 of the second cell row 6.

Although both VDD and VSS are separated into VDD1 and VDD2 and into VSS1 and VSS2 between the first portion 41 and the second portion 42 in the above description, only either VDD or VSS may be separated. For example, while VDD1 and VDD2 are different from each other, VSS1 and VSS2 may be the same. Alternatively, while VDD1 and VDD2 are the same, VSS1 and VSS2 may be different from each other.

Some of the reinforcing power supply pads 146 to 148 may not necessarily be placed. Also, a plurality of sets of the reinforcing power supply pads 146 to 148 may be provided.

The reinforcing power supply lines 23 to 26 and the interconnects 18 (interconnects 180 to 186, 189, 190, 195, and 196) are placed in different wiring layers from each other to avoid shorting.

While the first cell row 5 is placed closer to the core region 2 than the second cell row 6 in the above embodiments and the alterations for convenience sake, the second cell row 6 may be placed closer to the core region 2 than the first cell row 5. In this case, the first pad group 16 and the second pad group 17 are to be interchanged.

According to the present disclosure, reduction in the area of a semiconductor integrated circuit can be achieved by effectively using dead space produced when I/O cell rows are separated from each other. The present disclosure is therefore effective in downsizing and cost-reduction of LSI, for example.

What is claimed is:

1. A semiconductor chip comprising:
a core region in which an internal circuit is formed;
an I/O region lying between the core region and a periphery of the semiconductor chip;
a plurality of I/O cells placed in the I/O region; and
a plurality of external connecting pads connected with the outside of the semiconductor chip, wherein
the plurality of I/O cells include:
  a first cell row constituted by I/O cells arranged in a first direction, the first direction being a direction along the periphery of the semiconductor chip, and
  a second cell row constituted by I/O cells arranged in the first direction, spaced from the first cell row by a predetermined distance in a second direction perpendicular to the first direction,
the plurality of external connecting pads include:
  a plurality of cell connecting pads each connected to any of the plurality of I/O cells, and
  a reinforcing power supply pad that is not connected to any of the plurality of I/O cells and is connected to a cell connecting pad used for power supply out of the plurality of cell connecting pads,
the reinforcing power supply pad is placed so that the center of the reinforcing power supply pad lies in a region between the first cell row and the second cell row, and
the reinforcing power supply pad lies at the same position in the first direction as the cell connecting pad to which the reinforcing power supply pad is connected.

2. The semiconductor chip of claim 1, comprising:
a reinforcing power supply line formed to extend in the first direction in the region between the first cell row and the second cell row.

3. The semiconductor chip of claim 2, wherein
the reinforcing power supply line is placed in at least one of a region between the reinforcing power supply pad and the first cell row and a region between the reinforcing power supply pad and the second cell row.

4. The semiconductor chip of claim 2, wherein
the first cell row is separated in the first direction into a first portion to which first power is supplied and a second portion to which second power different from the first power is supplied,
the plurality of external connecting pads include a second reinforcing power supply pad that is not connected with any of the plurality of I/O cells and is connected with the reinforcing power supply line, and
the second reinforcing power supply pad is placed so that the center of the second reinforcing power supply pad lies in a region between the first portion and the second portion of the first cell row.

5. A semiconductor chip comprising:
a core region in which an internal circuit is formed;
an I/O region lying between the core region and a periphery of the semiconductor chip;
a plurality of I/O cells placed in the I/O region; and
a plurality of external connecting pads connected with the outside of the semiconductor chip, wherein
the plurality of I/O cells include:
  a first cell row constituted by I/O cells arranged in a first direction, the first direction being a direction along the periphery of the semiconductor chip, and
  a second cell row constituted by I/O cells arranged in the first direction, spaced from the first cell row by a predetermined distance in a second direction perpendicular to the first direction,
the plurality of external connecting pads include:
  a plurality of cell connecting pads each connected to any of the plurality of I/O cells, and
  a reinforcing power supply pad that is not connected to any of the plurality of I/O cells and is connected to a cell connecting pad used for power supply out of the plurality of cell connecting pads,
the reinforcing power supply pad is placed so that the center of the reinforcing power supply pad lies in a region between the first cell row and the second cell row,
the plurality of cell connecting pads include:
  a first pad group constituted by a plurality of the external connecting pads connected to I/O cells belonging to the first cell row, and
  a second pad group constituted by a plurality of the external connecting pads connected to I/O cells belonging to the second cell row, and
the reinforcing power supply pad is connected with a first cell connecting pad belonging to the first pad group and a second cell connecting pad belonging to the second pad group, and lies at a position between the first cell connecting pad and the second cell connecting pad in the first direction.

6. The semiconductor chip of claim 5, comprising:
a reinforcing power supply line formed to extend in the first direction in the region between the first cell row and the second cell row.

7. The semiconductor chip of claim 6, wherein
the reinforcing power supply line is placed in at least one of a region between the reinforcing power supply pad and the first cell row and a region between the reinforcing power supply pad and the second cell row.

8. The semiconductor chip of claim 6, wherein
the first cell row is separated in the first direction into a first portion to which first power is supplied and a second portion to which second power different from the first power is supplied,
the plurality of external connecting pads include a second reinforcing power supply pad that is not connected with any of the plurality of I/O cells and is connected with the reinforcing power supply line, and
the second reinforcing power supply pad is placed so that the center of the second reinforcing power supply pad lies in a region between the first portion and the second portion of the first cell row.

9. A semiconductor chip comprising:
a core region in which an internal circuit is formed;
an I/O region lying between the core region and a periphery of the semiconductor chip;
a plurality of I/O cells placed in the I/O region; and
a plurality of external connecting pads connected with the outside of the semiconductor chip, wherein
the plurality of I/O cells include:
    a first cell row constituted by I/O cells arranged in a first direction, the first direction being a direction along the periphery of the semiconductor chip, and
    a second cell row constituted by I/O cells arranged in the first direction, spaced from the first cell row by a predetermined distance in a second direction perpendicular to the first direction,
the plurality of external connecting pads include:
    a plurality of cell connecting pads each connected to any of the plurality of I/O cells, and
    a reinforcing power supply pad that is not connected to any of the plurality of I/O cells and is connected to a cell connecting pad used for power supply out of the plurality of cell connecting pads,
the reinforcing power supply pad is placed so that the center of the reinforcing power supply pad lies in a region between the first cell row and the second cell row,
the plurality of cell connecting pads include:
    a first pad group constituted by a plurality of the external connecting pads connected to I/O cells belonging to the first cell row, and
    a second pad group constituted by a plurality of the external connecting pads connected to I/O cells belonging to the second cell row, and
the reinforcing power supply pad is connected with a second cell connecting pad belonging to the second pad group and is not connected with any cell connecting pad belonging to the first pad group, and
the reinforcing power supply pad lies at a position where the center-to-center distance from the second cell connecting pad is shorter than the center-to-center distance from any cell connecting pad belonging to the first pad group.

10. The semiconductor chip of claim 9, comprising:
a reinforcing power supply line formed to extend in the first direction in the region between the first cell row and the second cell row.

11. The semiconductor chip of claim 10, wherein
the reinforcing power supply line is placed in at least one of a region between the reinforcing power supply pad and the first cell row and a region between the reinforcing power supply pad and the second cell row.

12. The semiconductor chip of claim 10, wherein
the first cell row is separated in the first direction into a first portion to which first power is supplied and a second portion to which second power different from the first power is supplied,
the plurality of external connecting pads include a second reinforcing power supply pad that is not connected with any of the plurality of I/O cells and is connected with the reinforcing power supply line, and
the second reinforcing power supply pad is placed so that the center of the second reinforcing power supply pad lies in a region between the first portion and the second portion of the first cell row.

13. A semiconductor chip comprising:
a core region in which an internal circuit is formed;
an I/O region lying between the core region and a periphery of the semiconductor chip;
a plurality of I/O cells placed in the I/O region; and
a plurality of external connecting pads connected with the outside of the semiconductor chip, wherein
the plurality of I/O cells include:
    a first cell row constituted by I/O cells arranged in a first direction, the first direction being a direction along the periphery of the semiconductor chip, and
    a second cell row constituted by I/O cells arranged in the first direction, spaced from the first cell row by a predetermined distance in a second direction perpendicular to the first direction,
the plurality of external connecting pads include:
    a plurality of cell connecting pads each connected to any of the plurality of I/O cells, and
    a reinforcing power supply pad that is not connected to any of the plurality of I/O cells and is connected to a cell connecting pad used for power supply out of the plurality of cell connecting pads,
the reinforcing power supply pad is placed so that the center of the reinforcing power supply pad lies in a region between the first cell row and the second cell row,
the reinforcing power supply pad comprises a plurality of reinforcing power supply pads, and
the plurality of reinforcing power supply pads are arranged in the first direction and mutually connected through an interconnect.

14. The semiconductor chip of claim 13, comprising:
a reinforcing power supply line formed to extend in the first direction in the region between the first cell row and the second cell row.

15. The semiconductor chip of claim 14, wherein
the reinforcing power supply line is placed in at least one of a region between the reinforcing power supply pad and the first cell row and a region between the reinforcing power supply pad and the second cell row.

16. The semiconductor chip of claim 14, wherein
the first cell row is separated in the first direction into a first portion to which first power is supplied and a second portion to which second power different from the first power is supplied, the plurality of external connecting pads include a second reinforcing power supply pad that is not connected with any of the plurality of I/O cells and is connected with the reinforcing power supply line, and the second reinforcing power supply pad is placed so that the center of the second reinforcing power supply pad lies in a region between the first portion and the second portion of the first cell row.

17. A semiconductor chip comprising:

a core region in which an internal circuit is formed;

an I/O region lying between the core region and a periphery of the semiconductor chip;

a plurality of I/O cells placed in the I/O region; and a plurality of external connecting pads connected with the outside of the semiconductor chip, wherein the plurality of I/O cells include:
   a first cell row constituted by I/O cells arranged in a first direction, the first direction being a direction along the periphery of the semiconductor chip, and
   a second cell row constituted by I/O cells arranged in the first direction, spaced from the first cell row by a predetermined distance in a second direction perpendicular to the first direction, the plurality of external connecting pads include:
   a plurality of cell connecting pads each connected to any of the plurality of I/O cells, and
   a reinforcing power supply pad that is not connected to any of the plurality of I/O cells and is connected to a cell connecting pad used for power supply out of the plurality of cell connecting pads, the reinforcing power supply pad is placed so that the center of the reinforcing power supply pad lies in a region between the first cell row and the second cell row, and the semiconductor chip further comprises a reinforcing power supply line formed to extend in the first direction in the region between the first cell row and the second cell row.

18. The semiconductor chip of claim 17, wherein the reinforcing power supply line is placed in at least one of a region between the reinforcing power supply pad and the first cell row and a region between the reinforcing power supply pad and the second cell row.

19. The semiconductor chip of claim 17, wherein the first cell row is separated in the first direction into a first portion to which first power is supplied and a second portion to which second power different from the first power is supplied, the plurality of external connecting pads include a second reinforcing power supply pad that is not connected with any of the plurality of I/O cells and is connected with the reinforcing power supply line, and the second reinforcing power supply pad is placed so that the center of the second reinforcing power supply pad lies in a region between the first portion and the second portion of the first cell row.

* * * * *